United States Patent
Kost

(10) Patent No.: US 7,436,256 B2
(45) Date of Patent: Oct. 14, 2008

(54) SYSTEMS AND METHODS FOR MAINTAINING MINIMUM PULSE WIDTH DURING SHUTDOWN

(75) Inventor: Michael A. Kost, Cedar Park, TX (US)

(73) Assignee: D2Audio Corporation, Austin, TX (US)

( * ) Notice: Subject to any disclaimer, the term of this patent is extended or adjusted under 35 U.S.C. 154(b) by 28 days.

(21) Appl. No.: 11/687,455

(22) Filed: Mar. 16, 2007

(65) Prior Publication Data

US 2007/0216478 A1    Sep. 20, 2007

Related U.S. Application Data

(60) Provisional application No. 60/783,212, filed on Mar. 17, 2006.

(51) Int. Cl.
    *H03F 3/38* (2006.01)
(52) U.S. Cl. .......................................... 330/10; 330/251
(58) Field of Classification Search .................... 330/10, 330/251, 207 A
    See application file for complete search history.

(56) References Cited

U.S. PATENT DOCUMENTS

| 4,716,274 A | * | 12/1987 | Gilliland | ................ | 219/130.21 |
| 6,696,891 B2 | * | 2/2004 | Noro et al. | ..................... | 330/10 |
| 6,734,725 B2 | * | 5/2004 | Masuda et al. | ................ | 330/10 |

* cited by examiner

*Primary Examiner*—Henry K Choe
(74) *Attorney, Agent, or Firm*—Law Offices of Mark L. Berrier

(57) ABSTRACT

Systems and methods for preventing violations of minimum pulse width requirements that may cause damage to PWM amplifiers. One embodiment comprises a digital PWM amplifier that includes shutdown circuitry which is configured to identify blockout intervals during which deassertion of the PWM signals would cause the generation of below-minimum-width pulses in the signals. Each blockout interval may, for example, begin 1 minimum pulse width before and end 1 minimum pulse width after a rising/falling edge the PWM signals. If a shutdown signal is asserted (or deasserted) during one of the blockout intervals, the PWM signals are deasserted (or reasserted) at the end of the blockout interval.

17 Claims, 5 Drawing Sheets

SYSTEMS AND METHODS FOR MAINTAINING MINIMUM PULSE WIDTH DURING SHUTDOWN

RELATED APPLICATIONS

This application claims the benefit of U.S. Provisional Patent Application 60/783,212, filed Mar. 17, 2006, which is incorporated by reference as if set forth herein in its entirety.

BACKGROUND

1. Field of the Invention

The invention relates generally to digital PWM amplifiers and more particularly to systems and methods for maintaining minimum pulse width during shutdown.

2. Related Art

Audio amplifiers are designed to receive input signals that typically have very low voltages and/or currents, and to generate corresponding output signals that generally have much higher voltages and/or currents. Because of these high voltages and/or currents, conditions may develop which present a danger to the amplifier and/or speakers.

For example, in a pulse-width modulation (PWM) amplifier, preventing the amplifier from generating excessive output current (creating an over-current condition) is one of the most critical functions, since this could damage the amplifier's output stages or the speakers driven by the output stages. The amplifier can avoid over-current conditions is various ways. Probably the most straightforward solution is to simply shut down the system whenever an over-current condition occurs.

The fastest and most dramatic way to shut down a PWM output stage is to tristate the PWM modulator (deassert the PWM signals that drive output FETs). The act of tristating the modulator, however, may violate a minimum pulse width requirement for the PWM signals output by the modulator. If the minimum pulse width requirement is violated, certain output stage designs, such as those using capacitively coupled output stages, may have error conditions that destroy the output stage.

Conventional solutions rely on an ad-hoc series of logic blocks after the shutdown logic to prevent MPW (Minimum Pulse Width) violations. These MPW compensation logic blocks normally examine pulses produced by the PWM modulator to determine whether they have widths which are less than a minimum threshold. If a pulse width is less than the minimum threshold, the MPW compensation blocks typically stretch the pulses so that they no longer violate the MPW requirement. This stretching of the pulses, however, may have other adverse consequences, such as cross-conduction in the stretched region (since both PWMH and PWML are asserted). This could be corrected with additional compensation circuitry, but the correction for cross-conduction may also cause subsequent minimum pulse width violations. It would therefore be desirable to provide systems and methods for preventing minimum pulse width violations which do not suffer from these drawbacks.

SUMMARY OF THE INVENTION

One embodiment comprises a pulse width modulated (PWM) amplifier having an output stage and shutdown circuitry. The output stage includes high-side and low-side switches (e.g., FET's) that are controlled (switched on and off) by high-side and low-side PWM signals. The shutdown circuitry is configured to shut down the output stage when necessary, but to inhibit shutdown during periods in which shutdown would cause minimum pulse width violations. The shutdown circuitry may also be configured to prevent deassertion of shutdown (i.e., reassertion of the PWM signals) during periods in which this would cause minimum pulse width violations. The shutdown circuitry may be implemented in a PWM modulator of the amplifier.

In one embodiment, the shutdown circuitry is configured to generate blockout intervals during which deassertion of the high-side and low-side PWM signals is inhibited. These blockout intervals may, for example, be 2 minimum pulse widths wide and centered on the rising and falling edges of the PWM signals. If the shutdown signal is asserted during one of the blockout intervals, the high-side and low-side PWM signals are deasserted at the end of the blockout interval. If the shutdown signal is deasserted during one of the blockout intervals, reassertion of the high-side and low-side PWM signals is disabled during the blockout interval and enabled at the end of the blockout interval.

Another embodiment comprises a method implemented in a PWM amplifier. The method includes generating high-side and low-side PWM signals, receiving a shutdown signal, and either enabling or inhibiting deassertion of the PWM signals, depending upon whether this would cause minimum pulse width violations. When the shutdown signal is asserted, deassertion of the PWM signals is inhibited if it would cause minimum pulse width violations or enabled if it would not cause minimum pulse width violations. Similarly, the method may include, when the shutdown signal is deasserted, inhibiting reassertion of the PWM signals if it would cause minimum pulse width violations or enabling reassertion of the PWM signals if it would not cause minimum pulse width violations. The method may include generating blockout intervals during which deassertion of the high-side and low-side PWM signals is inhibited. If the shutdown signal is asserted during one of the blockout intervals, the high-side and low-side PWM signals are deasserted at the end of the blockout interval. Each blockout interval may, for example, begin 1 minimum pulse width before and end 1 minimum pulse width after a rising or falling edge of one of the high-side and low-side PWM signals.

Numerous alternative embodiments are also possible.

BRIEF DESCRIPTION OF THE DRAWINGS

Other objects and advantages of the invention may become apparent upon reading the following detailed description and upon reference to the accompanying drawings.

Figure 1:
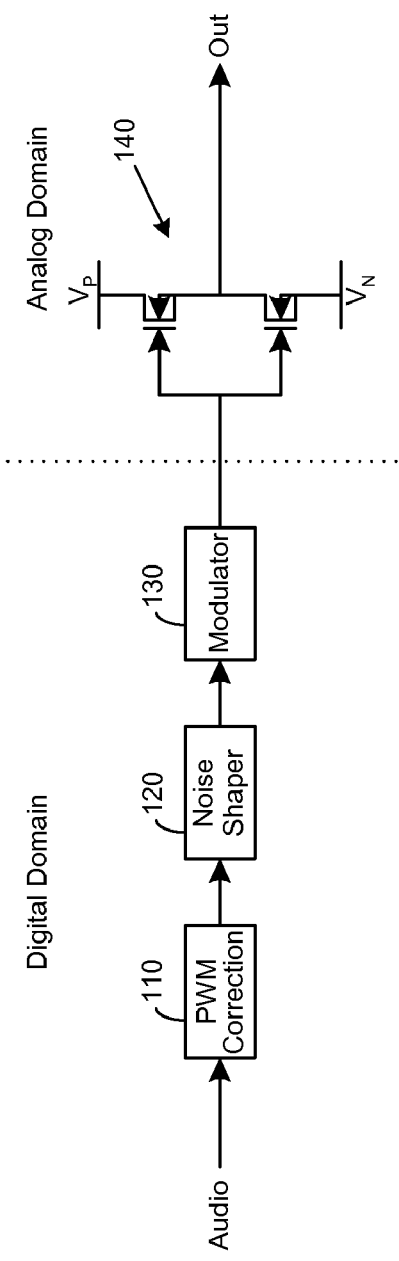
FIG. 1 is a diagram illustrating a typical PWM amplification system in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for preventing violations of minimum pulse width requirements that may cause damage to PWM amplifiers.

One embodiment of the invention comprises a digital PWM amplifier that includes shutdown circuitry which is configured to shut down the output stage of the amplifier without causing the generation of below-minimum-width pulses in the PWM signals that drive the power switches of the output stage.

The PWM amplifier includes PWM pre-correction circuitry, a noise shaper, a PWM modulator and an output stage. The PWM pre-correction circuitry receives a PCM input audio signal and pre-corrects for PCM-to-PWM conversion non-linearities. The noise shaper receives the audio signal from the PWM pre-correction circuitry, noise shapes the signal and quantizes the signal for use by the modulator. The modulator converts the quantized PCM audio signal to a pair of PWM signals and provides the PWM signals to the output stage. The PWM signals drive the output stage to produce an analog output audio signal.

The PWM modulator includes a rise/fall calculation block, a modulator comparator, and a shutdown system which includes circuitry to inhibit shutdown of the modulator during intervals in which shutdown would result in minimum pulse width violations. The rise/fall calculation block receives the quantized PCM signal from the noise shaper and calculates the times at which rising and falling edges of a corresponding pulse of the PWM signal should occur. The modulator comparator receives the calculated rise and fall times and produces a pair of PWM signals. The PWM signals are provided to the shutdown system, which is configured to shutdown the system by deasserting the PWM signals when appropriate.

The shutdown system includes a second rise/fall calculation block which is configured to calculate the times at which the rising and falling edges occur in a signal which will be used to inhibit or block shutdown of the system (the block-Shutdown signal). These signals are provided to a pair of modulator comparators which generate corresponding pulses that are combined to form the blockShutdown signal. The blockShutdown signal is asserted during intervals in which deassertion of the PWM signals would cause a minimum pulse width violation. The blockShutdown signal, as well as a shutdown signal which indicates that the system needs to be shut down, are provided to circuitry which is configured to deassert the PWM signals. If the shutdown signal is asserted while the blockShutdown signal is deasserted, the PWM signals are immediately deasserted. If the shutdown signal is asserted while the blockShutdown signal is asserted, the shutdown signal is inhibited, and the PWM signals are not deasserted until the blockShutdown signal is deasserted.

Before describing the exemplary embodiments of the invention in detail, it will be helpful to describe a conventional system. A typical PWM system is shown in FIG. 1. The PWM system consists of a PWM controller and an output stage. Inside the PWM controller is a PWM correction block, a noise shaper block, and a modulator block. In normal operation, a digital audio signal is provided to the amplifier. The digital audio signal is typically in a 24-bit, pulse-code modulated (PCM) format and typically supplied at a 512 kHz sampling rate. A PWM nonlinearity correction block (110) applies a pre-correction to the digital audio signal that approximately corrects for the non-linear artifacts created by the PCM to PWM conversion. The pre-corrected digital audio is then noise-shaped in the noise shaper (120). The noise shaper typically quantizes the 24-bit PCM digital audio sample to a 10-bit PCM digital audio sample and uses noise shaping techniques to reduce the quantization noise inside the audio band, typically DC to 20 or 40 kHz. The modulator block (130) performs the PCM to PWM conversion on the 10-bit digital audio. 2-level modulation is typically used, but other PWM modulation schemes, like 3-level (class BD) modulation may also be used. The output stage (140) amplifies the PWM waveforms generated by the modulator block, typically utilizing high voltage power supplies, high power field-effect transistors (FETs), and various other components. The output stage produces an analog output which is typically filtered by a passive LC filter to attenuate the PWM switching signal and is provided to a load such as a speaker.

Figure 2:
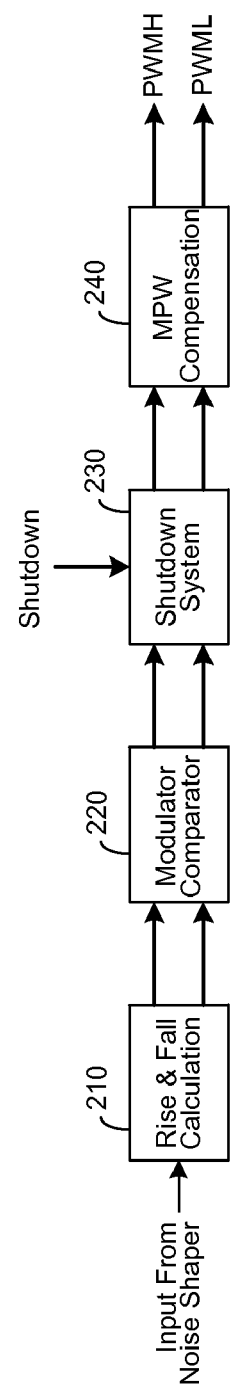
FIG. 2 is a diagram illustrating a typical PWM modulator in accordance with the prior art.

A typical PWM modulator is shown in FIG. 2. The PWM modulator consists of a rise & fall calculation block (210), a modulator comparator (220), and a shutdown block (230). The noise shaper provides an audio value that already accounts for the minimum pulse width. The rise and fall calculation block determines the appropriate locations in the PWM signal for the rising and falling edges of each PWM pulse. The rise and fall calculation takes into account different modulation types and dead time correction. The modulator comparator compares the rise and fall values against a digital triangle wave to create the output PWM waveform. Typically, a modulator comparator block will generate both the PWM high-side FET control and the PWM low-side FET control.

The Shutdown System (230) tristates the output of the modulator (deasserts both the high-side and low-side PWM signals) when requested by the Shutdown signal. The shutdown signal is an asynchronous signal that is asserted when the output of the modulator should deasserted, thus shutting down the output stage. The shutdown signal be be asserted as a result of a variety of conditions, such as overcurrent conditions in the output stage, which might cause the system to be damaged if it were allowed to continue to operate. The shutdown signal can be triggered by PWM control registers, external circuitry monitoring overcurrent in the output stage, or other mechanisms. When the shutdown signal is asserted, the MPW Compensation block (240) corrects any minimum pulse width violations that may occur, including those that happen due to a shutdown.

Figure 3:
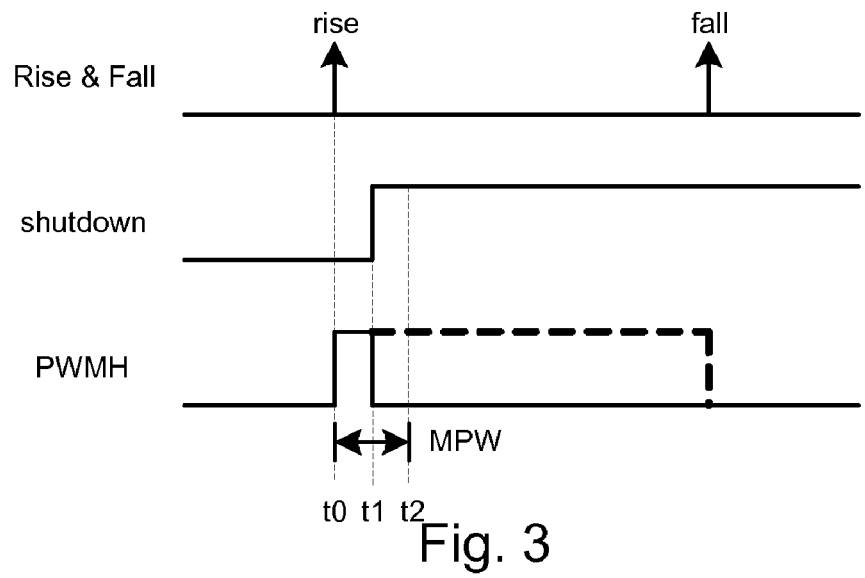
FIG. 3 is a diagram illustrating improper shutdown behavior resulting in a minimum pulse width violation.

Improper shutdown behavior is shown in FIG. 3. Without MPW compensation, if the shutdown signal asserts at the beginning of the PWMH pulse, the pulse will immediately deassert to tristate the output FET. As a result, the width of the PWM pulse will be less than the minimum pulse width—a minimum pulse width violation. Capacitively coupled output stages require PWM signals of a minimum width to ensure that sufficient charge is passed to the FET gate to fully switch on or switch off the FET. If the minimum pulse width is violated (i.e., if the pulse width is less than a minimum threshold,) the output FET may not be fully switched on or switched off. It will instead be in a linear conduction region, and will remain there until the next switching edge. PWM output stages are not designed to operate in this linear conduction region, and will typically overheat and be destroyed if they remain in this operating region. In shutdown situations, the next switching edge in the PWM signal may be several microseconds away, which may be sufficient time to destroy the output FET if it is operating in the linear region.

MPW violations in this conventional system are corrected via a shutdown MPW compensation block. The MPW compensation is an ad-hoc implementation which is placed after and in series with the modulator. The MPW compensation block stretches the switching edges to meet minimum pulse width requirements. For example, when the shutdown signal de-asserts less than a minimum pulse width before the PWMH signal de-asserts, the MPW correction block stretches PWMH. This results in cross-conduction in the stretched region since both PWMH and PWML are asserted. This could be corrected with additional logical checks, but doing so introduces the possibility that the correction for cross-conduction may result in a further minimum pulse width violation.

The present solution to the minimum pulse width problem is to generate a blockout window around the rise and fall times where the shutdown signal is not allowed to affect the output. This can be while shutdown is asserting or deasserting. This is referred to as the blockShutdown signal. A waveform is shown in FIG. 4.

Figure 4:
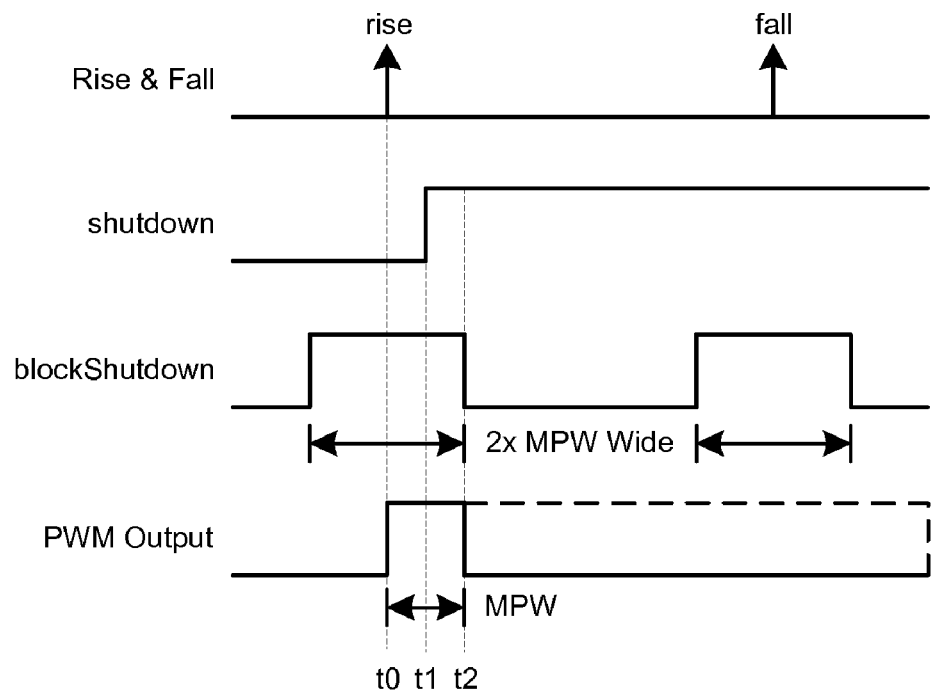
FIG. 4 is a diagram illustrating the use of a blockShutdown signal in accordance with one embodiment to prevent a Shutdown signal from deasserting a PWM pulse and thereby causing a minimum pulse width violation.

At the top of FIG. 4 is an indication of the rise and fall times that are calculated for the PWM signals. It can be seen that the blockShutdown signal in FIG. 4 has a pulse corresponding to the rise time and a pulse corresponding to the fall time. The pulses are centered on the corresponding rise/fall times. The width of each pulse is twice the minimum pulse width.

FIG. 4 also includes an example of a shutdown signal which is asserted during the blockout window around the rise time. In a conventional system, the shutdown signal would cause the PWM pulse which started at the rise time (t0) to be deasserted at t1, resulting in a below-minimum pulse width that would later have to be corrected. The blockShutdown signal, however, is used to inhibit the shutdown signal during the blockout window. At the end of the blockout window, the shutdown signal is no longer inhibited, so the PWM pulse is de-asserted at t2.

Figure 5:
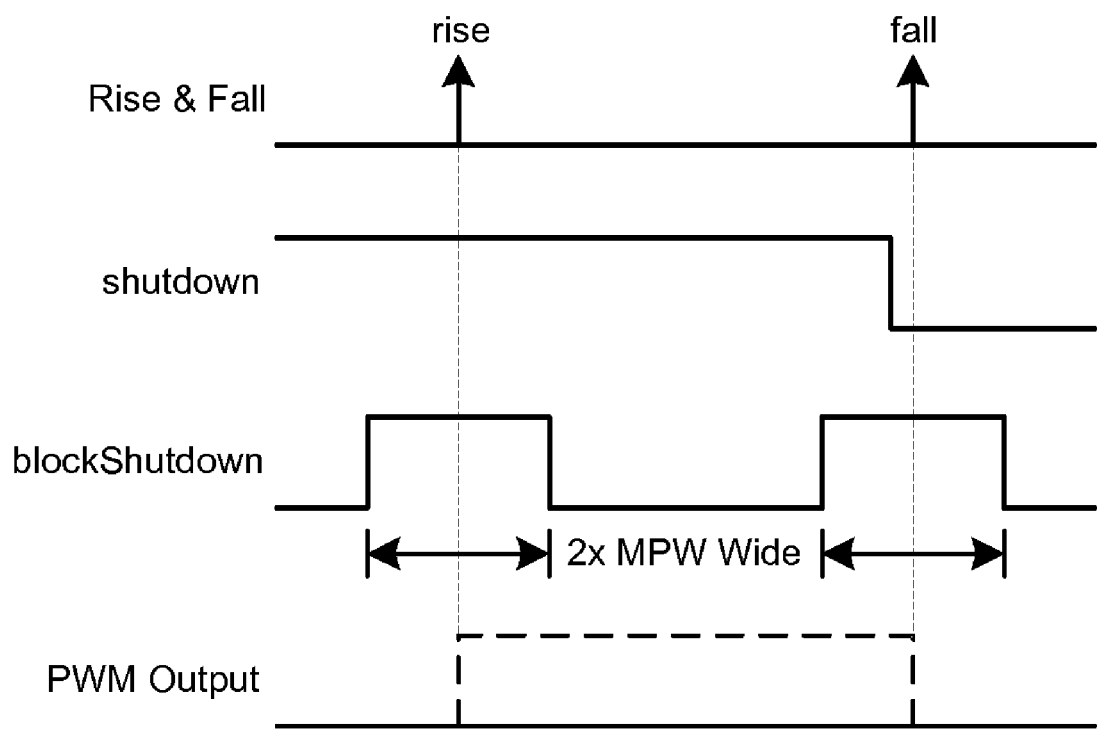
FIG. 5 is a diagram illustrating the use of a blockShutdown signal in accordance with one embodiment to prevent deassertion of a Shutdown signal from causing a minimum pulse width violation.

The shutdown deassertion case is shown in FIG. 5. In this case, the shutdown signal is asserted prior to the rise time and into the blockout window around the fall time, so the PWM pulse is completely inhibited. The PWM output pulse in the absence of the shutdown signal is illustrated by the dashed line at the bottom of the figure. If the shutdown signal had been deasserted prior to the second blockout window, the PWM output pulse would have begun (i.e., would have been reasserted) at the deassertion of the shutdown signal and ended at the calculated fall time, and would have had a width of at least one minimum pulse width.

This implementation removes the requirement for a post-shutdown minimum pulse width correction and simplifies interactions between minimum pulse width and shutdown.

Figure 6:
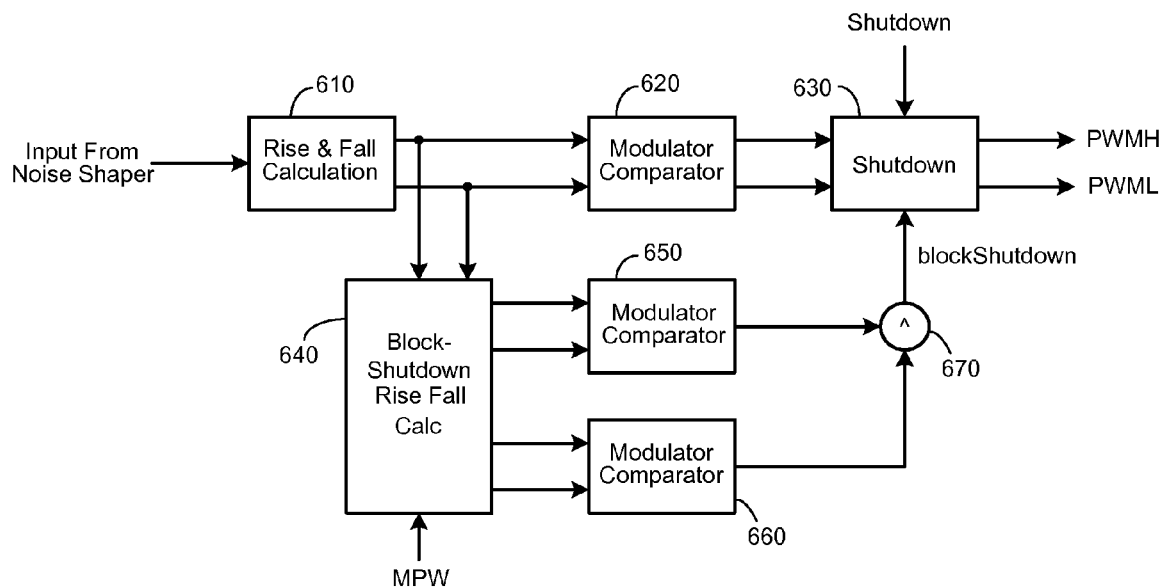
FIG. 6 is a diagram illustrating the structure of an exemplary modulator implementing blockout intervals as shown in of FIGS. 4 and 5.

The structure of an exemplary modulator implementing the blockout windows of FIGS. 4 and 5 is shown in FIG. 6. The PWM modulator of FIG. 6 consists of a rise & fall calculation block (610), a modulator comparator (620), and a shutdown block (630). The noise shaper provides a quantized PCM audio value to the rise and fall calculation block (610). The rise and fall calculation block (610) determines the times at which the rising and falling edges of each PWM pulse should occur, taking into account different modulation types and dead time correction. The modulator comparator (620) receives the rise and fall times form the rise and fall calculation block (610), and compares the rise and fall values to a triangle wave to generate the output PWM waveform. The modulator comparator block (620) generates both a high-side PWM signal to control a high-side FET, and a low-side PWM signal to control a low-side FET.

Both the high-side and low-side PWM signals are provided to the shutdown block (630). In addition to the PWM signals, the shutdown block (630) receives a Shutdown signal which indicates whether the system should be shut down, and a blockShutdown signal which either blocks or allows the de-assertion of the PWM signals by the Shutdown signal.

The blockShutdown signal is generated by blockShutdown rise/fall calculation block (640), modulator comparators (650 and 660) and XOR gate (670). The blockShutdown rise/fall calculation block (640) receives the rise and fall time values generated by the first rise/fall calculation block (610). Based on these values, the blockShutdown rise/fall calculation block (640) calculates two new sets of rise/fall times. In the first set, the rise time is one minimum pulse width before the original rise time, and the fall time is one minimum pulse width after the original fall time. In the second set, the rise time is one minimum pulse width after the original rise time, and the fall time is one minimum pulse width before the original fall time.

The first and second sets of rise/fall times are provided to modulator comparator (650) and modulator comparator (660), respectively. Each of the modulator comparators (650, 660) generates a corresponding pulse, which is then provided to XOR gate (670). The pulse generated by modulator comparator (650) is centered on the pulse generated by modulator comparator (620), but is 2 minimum pulse widths wider. Conversely, the pulse generated by modulator comparator (660) is centered on the pulse generated by modulator comparator (620), but is 2 minimum pulse widths narrower. When a logical XOR operation is performed on the pulses generated by modulator comparators (650 and 660), a blockout signal having two pulses is generated (unless the rise and fall times calculated by rise and fall calculation block 610 are less than 2 minimum pulse widths apart, in which case there will be a single pulse.)

Figure 7:
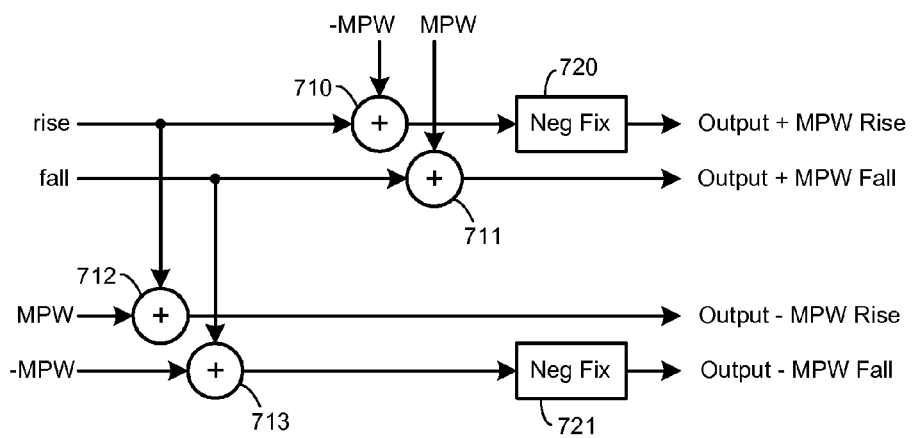
FIG. 7 is a diagram illustrating the structure of an exemplary blockShutdown rise/fall calculation block as may be used in the system of FIG. 6.

The blockShutdown rise/fall calculation block (640) may be implemented as shown in FIG. 7. In this figure, the rise and fall times generated by the first rise/fall calculation block (610) are input to four adders (710-713). The minimum pulse width is also input to adders 711 and 712, while the negative minimum pulse width is input to adders 710 and 713. The outputs of adders 710 and 713, respectively, are provided to blocks 720 and 721, which are configured to fix negative values of the received signal (i.e., if the values are negative, they are set to 0.) Then, the outputs of block 720 and adder 711 are provided to modulator comparator (650) as the first set of new rise/fall times, while the outputs of adder 712 and block 721 are provided to modulator comparator (660) as the second set of new rise/fall times.

The Neg Fix Block (720, 721) is implemented using the following verilog code:

```
if (in < 0)
    out <= 0;
else
    out <= in;
```

Figure 8:
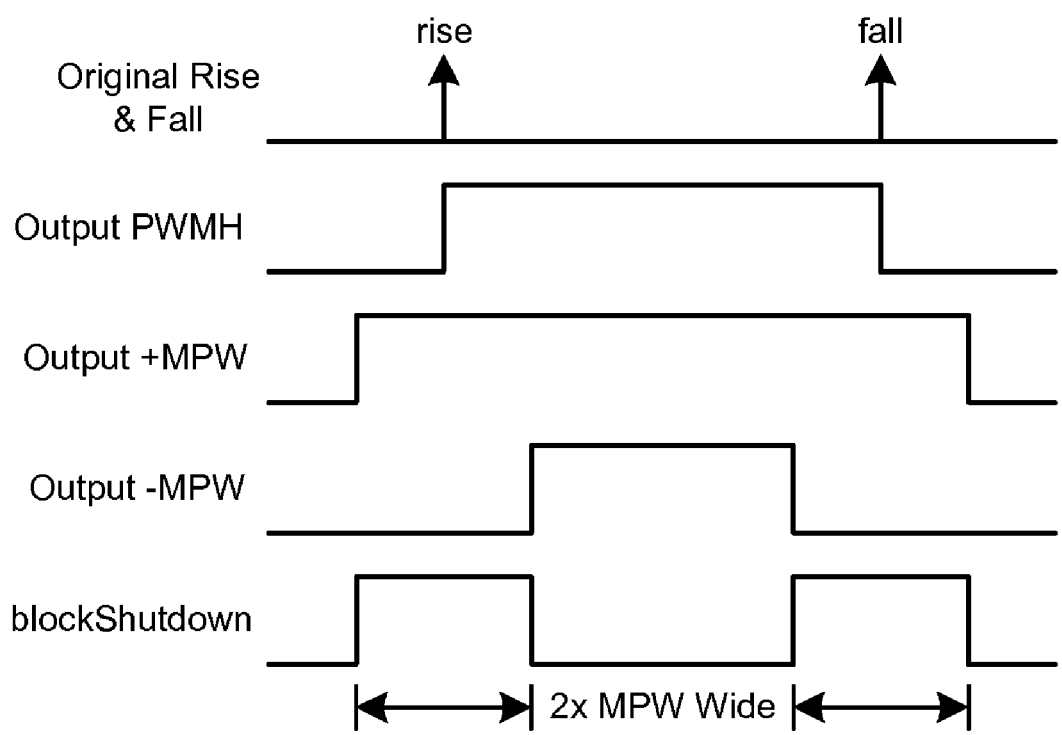
FIG. 8 is a diagram illustrating the different signals generated in the structure of FIG. 6.

FIG. 8 illustrates the different signals generated in the structure of FIG. 6. At the top of FIG. 8, the original rise and fall times calculated by rise and fall calculation block 610 are shown. Below the rise and fall times, the high-side PWM signal (PWMH) is shown. Below the high-side PWM signal, the signals output by modulator comparators (650 and 660) are shown. Finally, the output of the XOR gate (670) is shown at the bottom of the figure.

The foregoing description is directed to exemplary embodiments having particular features which may or may not be included in alternative embodiments. It should be noted that alternative embodiments may incorporate other features, or may be implemented in other ways. For instance, rather than generating two blocking signals that are 2 minimum pulse widths wider and narrower than the PWM pulse and XOR'ing these pulses, an alternative embodiment may generate 2-minimum-pulse-width-wide blocking pulses centered on the rise and fall times of the PWM pulse, and then AND the blocking pulses. In another alternative embodiment, the mechanism to inhibit the shutdown during the blocked out intervals could be implemented in a block of circuitry other than the modulator. For example, this mechanism could be implemented in the circuitry that asserts the shutdown signal, so that this signal could not be asserted within a minimum pulse width of the rising or falling edges of the PWM pulses. Still other variations which will be apparent to those skilled in the art.

Those of skill in the art will understand that information and signals disclosed herein may be represented using any of a variety of different technologies and techniques. For example, data values, signals and other information that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with digital signal processors (DSPs) or other logic devices, application specific integrated circuits (ASICs), field programmable gate arrays (FPGAs), discrete gates or transistor logic, discrete hardware components, or any combination thereof designed to perform the functions described herein.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system implemented in a pulse width modulated (PWM) amplifier, comprising:
    an output stage having
        a high-side switch configured to receive a high-side PWM signal, wherein the high-side PWM signal is applied to the high-side switch to turn the high-side switch on and off, and
        a low-side switch configured to receive a low-side PWM signal, wherein the low-side PWM signal is applied to the low-side switch to turn the low-side switch on and off; and
    shutdown circuitry coupled to the output stage and configured to inhibit shutdown of the output stage during periods in which shutdown would cause minimum pulse width violations.

2. The system of claim 1, wherein the shutdown circuitry is further configured to prevent deassertion of shutdown of the output stage during periods in which deassertion of shutdown would cause minimum pulse width violations.

3. The system of claim 1, wherein the shutdown circuitry is implemented in a PWM modulator of the PWM amplifier, wherein the PWM modulator is configured to generate the high-side and low-side PWM signals.

4. The system of claim 3, wherein the shutdown circuitry is configured to receive a shutdown signal and to deassert the high-side and low-side PWM signals at a time at which deassertion of the high-side and low-side PWM signals will not cause minimum pulse width violations.

5. The system of claim 4, wherein the shutdown circuitry is configured to generate blockout intervals during which deassertion of the high-side and low-side PWM signals is inhibited.

6. The system of claim 5, wherein if the shutdown signal is asserted during one of the blockout intervals, the high-side and low-side PWM signals are deasserted at the end of the blockout interval.

7. The system of claim 5, wherein if the shutdown signal is deasserted during one of the blockout intervals, assertion of the high-side and low-side PWM signals is disabled during the blockout interval and enabled at the end of the blockout interval.

8. The system of claim 3, wherein the shutdown circuitry is configured to: identify one or more blockout intervals where deassertion of the high-side and low-side signals would violate minimum pulse widths; and inhibit deassertion of the high-side and low-side PWM signals during the blockout intervals.

9. The system of claim 8, wherein the shutdown circuitry is configured to inhibit deassertion of the high-side and low-side PWM signals within 1 minimum pulse width of a rising edge or a falling edge of a pulse in one of the high-side and low-side PWM signals.

10. A method implemented in a pulse width modulated (PWM) amplifier, comprising:
generating a high-side PWM signal and a low-side PWM signal;
receiving a shutdown signal; and
when the shutdown signal is asserted,
inhibiting deassertion of the PWM signals during periods in which deassertion of the PWM signals would cause minimum pulse width violations, and
enabling deassertion of the PWM signals during periods in which deassertion of the PWM signals would not cause minimum pulse width violations.

11. The method of claim 10, further comprising: when the shutdown signal is asserted,
inhibiting reassertion of the PWM signals during periods in which reassertion of the PWM signals would cause minimum pulse width violations, and
enabling reassertion of the PWM signals during periods in which reassertion of the PWM signals would not cause minimum pulse width violations.

12. The method of claim 10, wherein the method is implemented in a PWM modulator of the PWM amplifier.

13. The method of claim 12, further comprising generating blockout intervals during which deassertion of the high-side and low-side PWM signals is inhibited.

14. The method of claim 13, further comprising, if the shutdown signal is asserted during one of the blockout intervals, deasserting the high-side and low-side PWM signals at the end of the blockout interval.

15. The method of claim 13, further comprising, if the shutdown signal is deasserted during one of the blockout intervals, reasserting the high-side and low-side PWM signals at the end of the blockout interval.

16. The method of claim 13, wherein each blockout interval comprises an interval beginning 1 minimum pulse width before and ending 1 minimum pulse width after a rising or falling edge of one of the high-side and low-side PWM signals.

17. The method of claim 13, further comprising applying the PWM signals to an output stage of the PWM amplifier.

* * * * *